United States Patent
Takaura et al.

(10) Patent No.: US 8,961,709 B1
(45) Date of Patent: Feb. 24, 2015

(54) SOLDER PASTE

(75) Inventors: Kunihito Takaura, Mouka-shi, Tochigi (JP); Kaichi Tsuruta, Haga-gun, Tochigi (JP); Hiroshi Kawanakago, Shimotsuga-gun, Tochigi (JP); Hiroshi Takahashi, Utsunomiya-shi, Tochigi (JP)

(73) Assignee: Senju Metal Industry Co., Ltd., Tokyo (JP)

( * ) Notice: Subject to any disclaimer, the term of this patent is extended or adjusted under 35 U.S.C. 154(b) by 1137 days.

(21) Appl. No.: 10/588,647

(22) PCT Filed: Mar. 9, 2004

(86) PCT No.: PCT/JP2004/003027
§ 371 (c)(1),
(2), (4) Date: Jun. 15, 2007

(87) PCT Pub. No.: WO2005/084877
PCT Pub. Date: Sep. 15, 2005

(51) Int. Cl.
*B23K 35/34* (2006.01)

(52) U.S. Cl.
USPC .............................. 148/24; 75/255

(58) Field of Classification Search
USPC .................. 75/252, 255; 420/557; 148/24
IPC ............ B23K 35/025,35/262; H01L 2924/0133
See application file for complete search history.

(56) References Cited

U.S. PATENT DOCUMENTS

| | | | |
|---|---|---|---|
| 5,256,370 A | 10/1993 | Slattery et al. | 420/557 |
| 5,573,602 A | 11/1996 | Banerji et al. | 148/24 |
| 2006/0021466 A1* | 2/2006 | Goudarzi et al. | 75/255 |

FOREIGN PATENT DOCUMENTS

| | | |
|---|---|---|
| EP | 0568952 | 11/1993 |
| EP | 0787559 | 8/1997 |
| JP | 01241395 | 9/1989 |
| JP | 1266987 | 10/1989 |
| JP | 01271094 | 10/1989 |
| JP | 02211995 | 8/1990 |
| JP | 06053645 | 2/1994 |
| JP | 09277082 | 10/1997 |
| JP | 11186712 | 7/1999 |
| JP | 11347784 | 12/1999 |
| JP | 2000052082 | 2/2000 |
| JP | 2001058286 | 3/2001 |
| JP | 2002113590 | 4/2002 |
| JP | 2002120085 | 4/2002 |
| JP | 2002254195 | 9/2002 |
| JP | 2003039193 | 2/2003 |
| WO | 20040809573 | 10/2004 |

OTHER PUBLICATIONS

"Lead-Free Solders for Electronic Assembly" by J.H. Vincent and G. Humpston, The GEC Journal of Research, 11 (1994), No. 2, Jan. 1, 1994, pp. 76-89.

* cited by examiner

*Primary Examiner* — Weiping Zhu
(74) *Attorney, Agent, or Firm* — Michael Tobias

(57) ABSTRACT

A solder paste using a Sn—Ag base, Sn—Cu base, or similar alloy powder has a high melting point, so it causes thermal damage to electronic devices. Sn—Ag—In base lead-free solder alloys having a low melting temperature have been studied, but they are difficult to use because they cause much occurrence of chips standing up during reflow.

The present invention forms a solder paste by separating a Sn—Ag—In base lead-free solder into first and second solder alloy powders for which the difference in their peak temperatures measured by differential thermal analysis is at least 10° C. and blends the mixed powders with a flux.

8 Claims, 2 Drawing Sheets

SOLDER PASTE

TECHNICAL FIELD

This invention relates to a solder paste for use in soldering electronic devices to printed circuit boards. In particular, it relates to a solder paste containing a Sn—Ag—In base lead-free solder alloy.

BACKGROUND ART

Single-function electronic devices such as resistors and capacitors in the form of chips having electrodes formed at both ends of a body are coming to be used. The reflow method is employed to solder surface mounted devices (SMD) like these chip devices to a printed circuit board. According to the reflow method, a solder paste comprising a solder alloy powder and a paste-like flux is applied by printing or dispensing the paste onto the portions of a printed circuit board to be soldered, i.e., to locations corresponding to the electrodes of SMD's, and then the printed circuit board is heated in a reflow furnace to melt the solder alloy powder to solder the surface mounted devices to the printed circuit board.

In this reflow method, in order to prevent splashing of the paste-like flux during heating as well as to reduce thermal damage to electronic devices and printed circuit boards, preheating is carried out at 100-150° C., and then main heating is carried out to melt the solder alloy powder in the solder paste and to adhere it to the portions to be soldered. In order to reduce thermal damage to electronic devices, the maximum temperature, which is called the peak temperature, is made as low as possible, and the heating time at that temperature is made as short as possible during the main heating.

The main heating temperature is suitably determined based on factors such as the size and thickness of the printed circuit board and the mounting density of electronic parts. Of course, in order to completely melt the solder alloy powder used in the solder paste, the main heating temperature must be higher than the liquidus temperature of the solder alloy powder. Accordingly, the lower the liquidus temperature of the solder alloy powder, the lower the main heating temperature becomes, resulting in less thermal effects on electronic devices. In general, the main heating temperature is said to be 20 to 40° C. higher than the liquidus temperature of the solder alloy of the solder paste.

Recently, the use of lead-free solders which do not contain any lead is being promoted. Lead-free solder alloys are also coming to be used in solder paste.

A lead-free solder is a solder alloy having Sn as a main component to which Ag, Cu, Bi, Sb, Zn, or the like is suitably added in accordance with the use.

In the case of Sn—Cu base lead-free solder alloys, the eutectic composition alloy, i.e., Sn-0.7Cu alloy has a melting point of 227° C. The main heating temperature, therefore, becomes high, resulting in thermal damage to electronic devices during reflow. Moreover, this solder alloy has the problem that its solderability is not good.

In the case of Sn—Bi base lead-free solder alloys, the eutectic composition alloy, i.e., Sn-57Bi alloy has as a melting temperature as low as 139° C., so the main heating temperature is even lower than that of a conventional Sn—Pb eutectic solder, and there is no concern whatsoever of thermal damage to electronic devices during reflow. However, a lead-free solder with this composition contains a large amount of Bi, so it has the property of being extremely brittle, and it has the problem that debonding readily takes place if even somewhat of an impact is applied to soldered portions after soldering.

In the case of Sn—Zn base lead-free solder alloys, the eutectic composition alloy, i.e., Sn-9Zn alloy has a melting point of 199° C., and the main heating temperature is at most 230° C., so there is little thermal damage at the time of reflow. However, Zn has the disadvantages that it easily oxidizes and that its wettability is extremely poor, so it is necessary to perform reflow in a non-oxidizing atmosphere or to use a special flux.

Sn—Ag base lead-free solder alloys have good wettability, so they are already much used. In particular, a Sn—Ag—Cu lead-free solder alloy in which at most 1% of Cu is added to a Sn—Ag solder alloy has better wettability than a Sn—Ag solder alloy, and the strength of the solder alloy is high, so at present, it is the most widely utilized.

However, in the case of Sn—Ag base lead-free solder alloys, the melting point of the eutectic composition alloy, i.e., Sn-3.5Ag, is 220° C., so the main heating temperature becomes at least 250° C., and thermal damage ends up being imparted to electronic devices which are sensitive to heat.

In contrast, a Sn—Ag—Cu lead-free solder alloy has a melting temperature of around 218° C., so the temperature to which a reflow furnace is set for main heating is often around 240° C. Damage due to heat seldom occurs with respect to most SMD's, even when the main heating temperature is around 240° C., but heat-sensitive devices such as semiconductor devices, connectors, and electrolytic capacitors are easily damaged by heat, and they may malfunction.

A lead-free solder alloy has been proposed in which the melting temperature thereof is lowered by the addition of an element such as Bi or In to a Sn—Ag solder alloy or a Sn—Ag—Cu solder alloy. However, since the addition of Bi may decrease the strength of the resulting solder alloy, Sn—Ag—In base solder alloys are widely used for soldering of electronic devices which are less resistant to heat.

A Sn—Ag—In base lead-free solder alloy is a lead-free solder alloy consisting of Sn, Ag, and In, or a Sn—Ag—In solder alloy further containing an element such as Bi or Cu.

As electronic equipment becomes miniaturized, electronic devices are also being miniaturized, as exemplified by 1608 components (16 mm×8 mm) and 1005 components (10 mm×5 mm). When reflow soldering of these small electronic devices is performed using solder paste, because electronic devices are light, it is easy for chips to stand up or tilt during reflow. Standing up or tilting of chips during reflow is referred to as tombstoning or the Manhattan phenomenon.

The phenomenon of chips standing up is a phenomenon in which when a substrate which is printed with solder paste is heated in a reflow furnace, due to a time difference in the heating of the solder paste at both ends of a chip, a time difference develops in the melting of the solder paste at both ends, a moment develops which pulls on one side of the chip, and the chip floats. If the moment which is generated becomes large, the chip ends up standing completely upside down.

Since the phenomenon of chips standing up becomes more prominent as the moment pulling on one end of a chip increases, it occurs more easily with alloys called eutectic composition alloy solders such as Sn-37Pb solder or Sn-3.5Ag in which there is no difference between the solidus temperature and the liquidus temperature. In contrast, in the case of solder alloys such as Sn-2Ag-36Pb (solidus temperature of 178° C. and liquidus temperature of 210° C.), Sn-8Bi-46Pb (159° C. and 193° C., respectively), and Sn-1Ag-0.5Cu (217° C. and 227° C., respectively), the solidus temperature and the liquidus temperature are spaced from each other, and melting of the solder alloy takes place so gradually that the moment pulling on one side of a chip component is lessened, and it becomes difficult for the phenomenon of chips standing up to occur. A Sn-3Ag-0.5Cu lead-free solder alloy, which is currently the most widely used lead-free solder alloy, has a solidus temperature of 217° C. and a liquidus temperature of 220° C., and a small temperature difference exists between them. Therefore, compared to a tin-lead eutectic solder alloy having a composition of Sn-37Pb, the phenomenon of chips standing up during reflow is decreased.

However, the phenomenon of chips standing up is particularly striking with the above-described Sn—Ag—In base lead-free solder alloy. Its advantage that it causes little thermal damage to electronic devices is not being fully utilized.

In the past, as a method of preventing chips from standing up during reflow, it has been proposed to use a solder alloy which can exhibit the twin-peak phenomenon (Japanese Published Unexamined Patent Application 2001-58286).

Mixing of solder alloy powders having at least two different alloy compositions has been carried out in the past. With respect to lead-free solder alloys as well, it is known to improve wettability by mixing a Sn—Zn base powder and a Sn—Zn—Bi base powder (Japanese Published Unexamined Patent Application Hei 9-277082), or to prevent the occurrence of voids or dewetting by mixing a Sn—Bi base powder and a Sn—Zn base powder (Japanese Published Unexamined Patent Application 2002-113590).

DISCLOSURE OF THE INVENTION

The present invention provides a solder paste of a Sn—Ag—In base lead-free solder alloy with which standing up of chips does not take place even though it uses a Sn—Ag—In base lead-free solder alloy with which standing up of chips readily occurs during reflow.

If an element which lowers the melting temperature such as In or Bi is added to a Sn-3.5Ag lead-free solder alloy or a Sn-3Ag-0.5Cu lead-free solder alloy, the melting temperature of the solder is lowered. At this time, the solidus temperature and the liquidus temperature are not simply lowered together. Namely, the solidus temperature is lowered, but the liquidus temperature is not necessarily lowered, and there is a tendency for the difference between the solidus temperature and the liquidus temperature to increase. Therefore, a solder alloy to which In, Bi, or the like has been added should decrease the phenomenon of chips standing up. Although the phenomenon of chips standing up during reflow decreases when Bi is added, the phenomenon of chips standing up during reflow occurs more frequently when In is added.

For example, the phenomenon of chips standing up during reflow occurs at least 20 times as often with a Sn-3.5Ag-8In lead-free solder alloy (solidus temperature of 197° C. and liquidus temperature of 214° C.) than with a Sn-3Ag-0.5Cu lead-free solder alloy. In contrast, the occurrence with a Sn-3.5Ag-8Bi lead-free solder alloy (solidus temperature of 186° C. and liquidus temperature of 207° C.) is half that occurring with a Sn-3Ag-0.5Cu lead-free solder alloy. While the surface tension of a solder alloy to which In has been added decreases and its wettability improves, since In is an element which readily oxidizes, melting of the solder is impeded. This results in inconsistent wetting, and standing up of chips develops.

Thus, it can be seen that in order to prevent chips from standing up, it is not enough to simply make the range between the liquidus temperature and the solidus temperature sufficiently broad.

Another element which can lower the melting temperature of lead-free solder alloys is Zn. The addition of Zn does not greatly lower the solidus temperature, but if Zn is added, the wettability of the solder alloy becomes so extremely poor that a moment does not suddenly act on chip parts. Thus, there is little occurrence of chips standing up during reflow when a lead-free solder alloy containing Zn is used.

It is therefore apparent that depending upon the solder alloy composition, the mechanism of preventing chips from standing up greatly varies. Accordingly, it cannot be predicted whether a means which is effective with a specified solder alloy will also be effective with another solder alloy if applied without modification.

As a countermeasure against chips standing up at the time of reflow, there is a method using two types of powders having different melting points. However, with a Sn—Ag—In base lead-free solder alloy, by merely forming a solder paste by simply mixing two types of powder having different melting points, the phenomenon of chips standing up does not decrease. This is because even though the wettability of a Sn—Ag—In base lead-free solder itself is good, In easily oxidizes.

The present inventors found that standing up of chips can be decreased with respect to a Sn—Ag—In lead-free solder alloy containing 3-4% Ag, 3-10% In, and a balance of Sn.

According to the prevent invention, the alloy composition is constituted by a first alloy powder and a second alloy powder. The difference in the peak temperatures measured by differential thermal analysis (DSC) of the solder alloy of the first alloy powder and the solder alloy of the second alloy powder is at least 10° C.

Particularly, the first solder alloy powder may be a Sn—Ag—In alloy powder and the second solder alloy powder may be a Sn—Ag alloy powder.

Thus, according to the present invention, standing up of chips can be effectively prevented not by simply using two types of solder alloy having different melting points, but by making the difference between the peak temperatures of the first solder alloy powder and the second solder alloy powder at least 10° C., the moment which is generated at the time of reflow can be reduced even with a Sn—Ag—In base lead-free solder alloy. Furthermore, standing up of chips can also be effectively prevented by making the composition after melting, in mass %, 3-4% Ag, 3-10% In, and a balance of Sn so as to make it difficult for the oxidation of In to occur.

It is preferable to add In as an alloy component to the solder alloy having a lower peak temperature so as to reduce oxidation of In as much as possible, whereby a moment which is generated due to the ready oxidation of In can be further reduced, and standing up of chips at the time of reflow can be all the more decreased. This can be described as an effect specific to a Sn—Ag—In base lead-free solder alloy.

The present invention is a solder paste comprising a powder mixture of a first solder alloy powder and a second solder alloy powder and a flux, characterized in that the first solder alloy powder and the second solder alloy powder have a difference of at least 10° C. in their main peak temperatures measured by differential thermal analysis, and the composition of the mixed powders after melting is, in mass %, 3-4% Ag, 3-10% In, and a balance of Sn.

In this specification, unless otherwise specified, % with respect to an alloy composition refers to mass %.

The first solder alloy powder is preferably a powder of an alloy comprising 3-4% Ag, 6-20% In, and a balance of Sn, and the second solder alloy powder is preferably a powder of an alloy comprising 3-4% Ag with a balance of Sn.

In the alloys of the first and second solder alloy powders, either one or both may contain at most 1% of Bi. In addition, the alloy of the second solder alloy powder having a higher peak temperature may contain at most 1% of Cu.

DETAILED EXPLANATION OF THE INVENTION

Specific examples of a Sn—Ag—In base lead-free solder alloy obtained by combining solder alloy powders of a first solder alloy and a second solder alloy for which the difference between the peak temperatures of the first solder alloy and the second solder alloy as measured by differential thermal analysis is at least 10° C. are as shown in Table 1, which is described with respect to the below-described examples.

In the present invention, the peak temperature was measured by differential thermal analysis using the below-described apparatus.

Measuring apparatus: Differential scanning calorimeter made by Seiko Instruments Measurement conditions:

Rate of temperature increase: 5° C./minute

Figure 1:
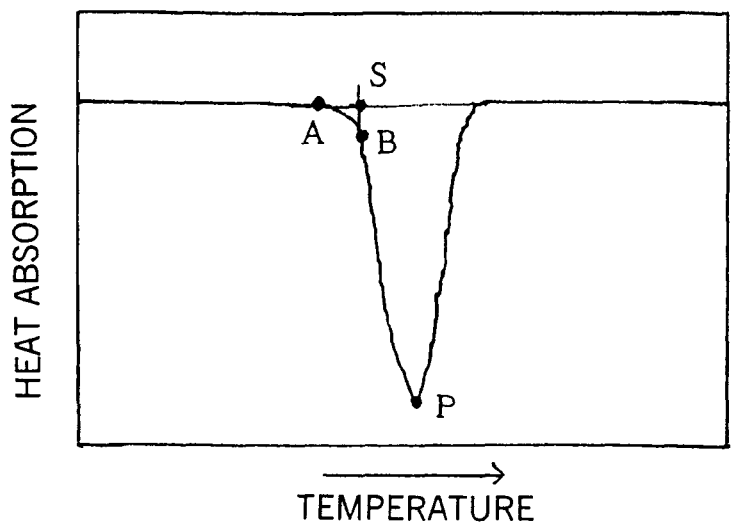
FIG. 1 is a graph showing a typical differential thermal analysis curve.

FIG. 1 shows a typical curve for differential thermal analysis. This is an example of an alloy which shows a clear single peak temperature P. In the figure, the extrapolation from point B is the solidus temperature S. In the illustrated example, the peak temperature and the temperature at the completion of melting, i.e., the liquidus temperature, are the same as each other. Point A indicates the start of heat absorption.

Figure 2:
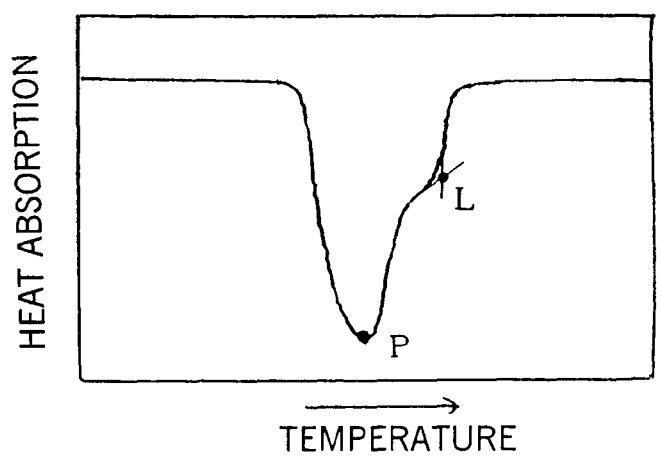
FIG. 2 is a graph showing another example of a differential thermal analysis curve.

FIG. 2 is a curve of differential thermal analysis showing the case in which the peak temperature P and the liquidus temperature L are different from each other. In this case, the liquidus temperature is on the high temperature side of the peak temperature.

When a plurality of peak temperatures can be seen, the peak temperature having the larger heat absorption, i.e., the main peak temperature is defined as the peak temperature of the present invention.

Even when difference between the peak temperatures of the first solder alloy and the second solder alloy is 10° C. or larger, wetting defects and the formation of solder balls may result, if the wettability of the solder alloy which is finally obtained is poor.

According to the present invention, in the case of an Sn—Ag—In solder alloy as a final composition, if the amount of Ag is less than 3%, wettability decreases, and if the amount of Ag exceeds 4%, the peak temperature increases. In either case, the solder cannot be applied to electronic devices having a low heat resistance. In addition, if the amount of In is less than 3%, the peak temperature is not lowered, and the solder cannot be applied to electronic devices having low heat resistance. If the amount of In exceeds 10%, In readily oxidizes to much lower wettability, and there is much formation of solder balls.

An example of a preferred combination of the first and second solder alloy according to the present invention is one in which the first solder alloy having a lower peak temperature is a Sn—Ag—In alloy containing 3-4% Ag, 6-20% In, and a balance of Sn, and the second solder alloy having a higher peak temperature is a Sn—Ag alloy containing 3-4% Ag and a balance of Sn.

The blending ratio of the first solder alloy powder and the second solder alloy powder in the present invention depends upon the composition of the first and second solder alloys, but in general, the ratio (mass) of the one solder alloy having a higher peak temperature to the other solder alloy having a lower peak temperature is (20-70)/(80-30), and preferably (25-65)/(75-35).

There are no particular limits in the present invention on the particle diameter of the powders, and it may be of the same order as that used in ordinary solder paste. For example, both the first and second solder alloy powders may have an average particle diameter of around 30 μm. Of course, if necessary, powders with a coarser or finer particle diameter may be used.

There are no particular restrictions on the flux component, and it may be the same as that of a solder paste using a conventional Sn—Ag—In base solder alloy. For example, all types of rosin fluxes and suitable solvents can be used. If necessary, an activator, a thixotropic agent, an oxidation inhibitor, and the like can be suitably blended therewith.

The effects of the present invention are not only the effect of preventing chips from standing up during reflow but also the effect of reducing voids. This is because a difference in the length of time for solder alloys to melt develops, and a solvent contained in the solder paste does not abruptly evaporate.

When the solder alloy composition of the present invention after melting is in the range of 3-4% Ag, 3-10% In, and a balance of Sn, oxidation of In becomes difficult, with the result that voids in a Sn—Ag—In base lead-free solder alloy are reduced, although In by its nature oxidizes readily.

In order to improve the wettability of a Sn—Ag—In base lead-free solder alloy according to the present invention, 1% or less of Bi can be added to the first solder alloy and/or the second solder alloy. A Sn—Ag—In base lead-free solder alloy has good wettability, but it has the drawback that In readily oxidizes. By adding Bi to a Sn—Ag—In base lead-free solder alloy, wettability is improved, and it becomes possible to form a soldered joint with few voids. However, if the content of Bi in the solder alloy after melting is greater than 1%, a decrease in the strength of the solder and lift-off occur, leading to debonding of joints. Therefore, when Bi is blended with the first solder alloy and/or the second solder alloy, the total amount of Bi which is added is at most 1%.

Therefore, according to one embodiment, the present invention is a solder paste characterized in that a first solder alloy powder comprises a powder of an alloy comprising 3-4% Ag, 6-20% In, and a balance of Sn, a second solder alloy powder comprises a powder of an alloy comprising 3-4% Ag and a balance of Sn, the solder alloys of the first and/or the second solder alloy powder contain a total of at most 1% of Bi, and a powder formed by mixing these powders is blended with a flux.

In the present invention, at most 1% of Cu can be added to the second solder alloy. If more than 1% of Cu is added, the melting temperature increases and wettability worsens, and this can easily cause voids. In this case, Cu is added to the alloy of the second alloy powder. By adding Cu to the alloy of the second solder alloy powder, the melting temperature is at least slightly lowered, and it becomes easy for the second solder alloy to fuse with the first solder alloy during reflow.

Therefore, according to another embodiment, the present invention is a solder paste characterized by blending a flux with mixed solder powders formed by mixing a first solder alloy powder having an alloy composition comprising 3-4%

Ag, 6-20% In, and a balance of Sn, and a second solder alloy powder having an alloy composition comprising 3-4% Ag, at most 1% Cu, and a balance of Sn.

In this embodiment as well, Bi may be added in order to improve wettability.

Therefore, according to yet another mode, the present invention is a solder paste characterized in that a flux is blended with mixed solder powders formed by mixing a first solder alloy powder having an alloy composition comprising 3-4% Ag, 6-20% In, and a balance of Sn, and a second solder alloy powder having an alloy composition comprising 3-4% Ag, at most 1% Cu, and a balance of Sn, and in that the solder alloys of the first and/or the second solder alloy powders contain in total at most 1% of Bi.

In the present invention, in any of these modes, the composition after melting of the first and second solder alloy powders is 3-4% Ag, 3-10% In, 0-1% Bi, 0-1% Cu, and a remainder of Sn.

Specific effects of the present invention will be described in detail in conjunction with working examples.

EXAMPLES

A first solder alloy powder and a second solder alloy powder (average particle diameter of 30 μm for each) having the alloy compositions and proportions shown in Table 1 were mixed, and then they were mixed with a flux having the following composition to obtain a solder paste. The percentages of the solder powder and the flux at this time were 89% for the mixed solder alloy powders and 11% for the flux.
(Flux Composition)
  acryl-modified rosin 30 mass %
  polymerized rosin 20 mass %
  hardened castor oil 5 mass %
  2-ethylhexyl diglycol 40 mass %
  2.3-dibromo 2-butene-1.4-diol 5 mass %

A chip standing test, a voids test, and a solder ball forming test were carried out by the following test methods on the solder pastes which were prepared.
(Chip Standing Test)

Examples and comparative examples of a solder paste were printed on a printed circuit board in the arrangement described below, and ninety 1005-size chip capacitors were mounted thereon. Next, the printed circuit board was turned upside down, and after reflow treatment was carried out in an inverted state, the number of chips which stood up or deviated from the initially-placed positions was counted. The occurrence of either was considered a soldering defect. In this example, the rate of occurrence of chips standing up was calculated based on the total number of these defects (n=3).
  printed shape: 0.5 mm (dot diameter)
  printing pitch: 1.0 mm
  metal mask thickness: 0.15 mm
(Voids Test)

Examples and comparative examples of a solder paste were printed on a printed circuit board in the arrangement described below, and reflow was performed without mounting of parts thereon. The number of lands on which voids having a size of at least half the land diameter occurred was counted. (n=3)
  number of dots: 36
  printed shape: 0.5 mm (dot diameter)
  printing pitch: 1.0 mm
  thickness of metal mask: 0.15 mm
(Test of Solder Ball Formation)

Using examples and comparative examples of a solder paste, a test of solder ball formation was carried out under the conditions set forth in JIS Z 3284 Appendix 11, and the state of solder ball formation was classified into the following four categories.

Category 1 is a state in which there are no solder balls, Category 2 is a state in which at most 3 solder balls having a diameter of at most 75 μm are formed, Category 3 is a state in which at least 4 are formed, and Category 4 is a state in which a large number of fine solder balls are arranged semi-continuously in a circle. Up to Category 2 is considered acceptable.
(Reflow Conditions)

Reflow for the chip standing test, the voids test, and the test of solder ball formation in this example was carried out under the following conditions.

Reflow furnace: Model SAI-3808JC made by Senju Metal Industry Co., Ltd.

Preheating temperature: 150-170° C. for 100 seconds

Main heating temperature: 220° C. (40 seconds at 200° C. or above)

The results are compiled in Table 1. As can be seen from the results, a solder paste according to the present invention which comprises a Sn—Ag—In base lead-free solder alloy and is prepared by combining solder powders of solder alloys for which the difference in the peak temperature of a first solder alloy and a second solder alloy measured by differential thermal analysis is at least 10° C. has a low occurrence of chip standing up and voids, and less formation of solder balls compared to a case in which the difference in the alloy peak temperatures is less than 10° C.

Figure 3:
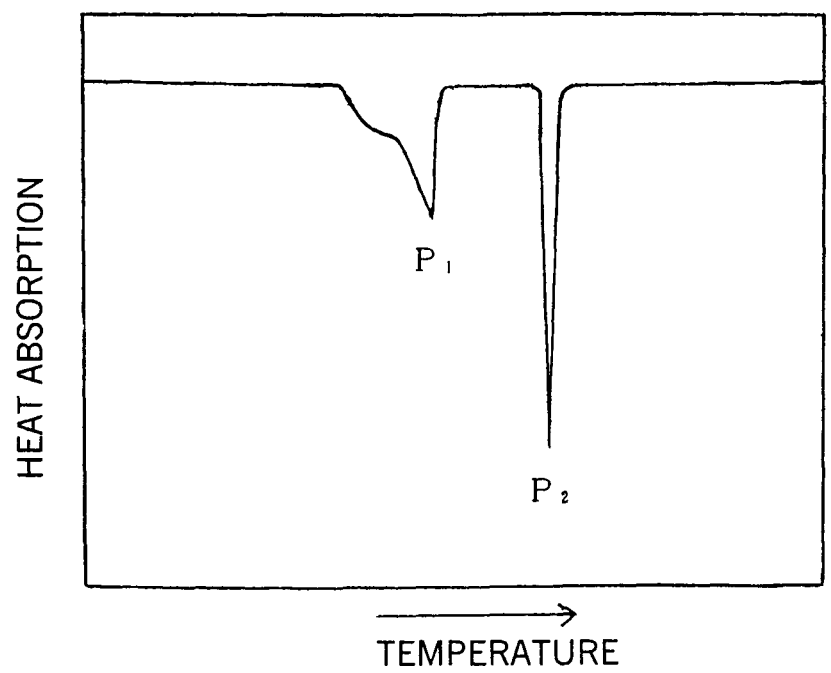
FIG. 3 is a graph showing a differential thermal analysis curve for a powder mixture of a first solder alloy powder and a second solder alloy powder used in examples.

FIG. 3 is a graph showing a differential thermal analysis curve for a solder alloy mixed powder formed by mixing 65% of a first solder alloy powder (Sn-3.5Ag-12In-0.5Bi) and 35% of a second solder alloy powder (Sn-3.5Ag-0.5Bi). The peak temperatures P1 and P2 of the first solder alloy powder and the second solder alloy powder, respectively, were separated by an adequate amount of at least 10° C., and the liquidus temperature of the first solder alloy powder and the solidus temperature of the second solder alloy do not overlap. In other words, in this case, first and second solder alloy powders having a difference in peak temperatures of at least 10° C. are selected and combined to form a solder paste. The composition after melting was Sn-3.5Ag-8In-0.5Bi.

A Sn—Ag—In base lead-free solder alloy according to the present invention is of course effective not only for soldering of chip parts but also for soldering of fine patterns.

TABLE 1

|  |  | First Alloy Powder | | Second Alloy Powder | | Difference |
| --- | --- | --- | --- | --- | --- | --- |
|  | No. | Composition | Peak Temp. (° C.) | Composition | Peak Temp. (° C.) | between Peak Temperatures (° C.) |
| Examples | 1 | Sn3Ag6In | 211 | Sn3Ag | 222 | 11 |
|  | 2 | Sn3.5Ag16In | 195 | Sn3.5Ag | 221 | 26 |
|  | 3 | Sn4Ag20In | 190 | Sn3.5Ag | 221 | 31 |

TABLE 1-continued

|  | No. | | | | | |
|---|---|---|---|---|---|---|
| | 4 | Sn3.5Ag12In1Bi | 202 | Sn3.5Ag0.5Bi | 220 | 18 |
| | 5 | Sn3.5Ag12In | 202 | Sn3.5Ag0.5Cu | 219 | 17 |
| | 6 | Sn3.5Ag12In | 202 | Sn3.5Ag0.5Bi0.5Cu | 217 | 15 |
| | 7 | Sn3.5Ag12In1Bi | 200 | Sn3.5Ag | 221 | 21 |
| | 8 | Sn3.5Ag12In1Bi | 200 | Sn3.5Ag0.5Bi | 220 | 20 |
| | 9 | Sn3.5Ag12In1Bi | 200 | Sn3.5Ag0.5Cu | 219 | 19 |
| | 10 | Sn3.5Ag12In1Bi | 200 | Sn3.5Ag0.5Bi0.5Cu | 217 | 17 |
| Comparatives | 1 | Sn2Ag3In | 217 | Sn3Ag | 222 | 5 |
| | 2 | Sn3Ag6In | 211 | Sn2Ag | 223 | 12 |
| | 3 | Sn4Ag20In | 190 | Sn5Ag | 223 | 33 |
| | 4 | Sn5Ag5In | 214 | Sn5Ag | 223 | 9 |
| | 5 | Sn4Ag30In | 172 | Sn3Ag | 222 | 50 |
| | 6 | Sn3.5Ag3In | 216 | — | — | 0 |
| | 7 | Sn3.5Ag8In | 209 | — | — | 0 |
| | 8 | Sn3Ag0.5Cu | 218 | — | — | 0 |

| | | Ratio (%) | | | Voids | | |
|---|---|---|---|---|---|---|---|
| | No. | First Alloy Powder | Second Alloy Powder | Alloy Composition after Melting | Chips standing up(%) | occurred (Number of Lands) | Solder Ball Category |
| Examples | 1 | 50 | 50 | Sn3.5Ag3In | 7 | 6 | 2 |
| | 2 | 50 | 50 | Sn3.5Ag8In | 0 | 0 | 2 |
| | 3 | 50 | 50 | Sn3.75Ag10In | 0 | 0 | 2 |
| | 4 | 50 | 50 | Sn3.5Ag6In0.75Bi | 4 | 4 | 2 |
| | 5 | 25 | 75 | Sn3.5Ag3In0.375Cu | 0 | 2 | 2 |
| | 6 | 50 | 50 | Sn3.5Ag6In0.25Bi0.25Cu | 2 | 3 | 2 |
| | 7 | 25 | 75 | Sn3.5Ag3In0.25Bi | 4 | 3 | 2 |
| | 8 | 50 | 50 | Sn3.5Ag6In0.75Bi | 3 | 4 | 2 |
| | 9 | 65 | 35 | Sn3.5Ag7.8In0.65Bi0.175Cu | 0 | 0 | 2 |
| | 10 | 50 | 50 | Sn3.5Ag6In0.75Bi0.25Cu | 5 | 3 | 2 |
| Comparatives | 1 | 50 | 50 | Sn2.5Ag1.5In | 18 | 14 | 2 |
| | 2 | 50 | 50 | Sn2.5Ag3In | 8 | 13 | 3 |
| | 3 | 50 | 50 | Sn4.5Ag10In | 0 | 8 | 4 |
| | 4 | 50 | 50 | Sn5Ag2.5In | 13 | 13 | 4 |
| | 5 | 50 | 50 | Sn3.5Ag15In | 0 | 11 | 4 |
| | 6 | | 100 | Sn3.5Ag3In | 32 | 15 | 2 |
| | 7 | | 100 | Sn3.5Ag8In | 24 | 28 | 2 |
| | 8 | | 100 | Sn3Ag0.5Cu | 3 | 10 | 2 |

INDUSTRIAL APPLICABILITY

As described above, even if a Sn—Ag—In base lead-free solder alloy, which can be used with electronic devices which do not have heat resistance but which is difficult to use because of the occurrence of chips standing up during reflow, is used in a solder paste according to the present invention, the occurrence of chips standing up during reflow and of voids is reduced. Therefore, it can be used with inexpensive electronic parts without heat resistance, and the present invention greatly advances the trend towards the use of lead-free solders.

The invention claimed is:

1. A lead-free solder paste comprising a first solder alloy powder of a first solder alloy, a second solder alloy powder of a second solder alloy, and a flux mixed with the first and second solder alloy powders, wherein the main peak temperature of the first solder alloy measured by differential thermal analysis is at least 10° C. lower than the main peak temperature of the second solder alloy measured by differential thermal analysis, the first solder alloy has a composition consisting of 3-4 mass % of Ag, 12-20 mass % of In, 0-1 mass % of Bi, and a balance of Sn, the second solder alloy has a composition consisting of 3-4 mass % of Ag, 0-1 mass % of Cu, 0-1 mass % of Bi, and a balance of Sn, and the overall composition after melting of the first and second solder alloy powders consists of 3-4 mass % of Ag, 3-10 mass % of In, 0-1 mass % of Bi, 0-1 mass % of Cu, and a balance of Sn.

2. A solder paste as claimed in claim 1 wherein the first solder alloy is a Sn—Ag—In alloy and the second solder alloy is a Sn—Ag alloy.

3. A solder paste as claimed in claim 1 wherein:
the first solder alloy is selected from a Sn—Ag—In alloy and a Sn—Ag—In—Bi alloy; and
the second solder alloy is selected from a Sn—Ag—Cu alloy and a Sn—Ag—Bi—Cu alloy.

4. A solder paste as claimed in claim 1 wherein the overall composition after melting of the first and second solder alloy powders contains 6-10 mass % of In.

5. A solder paste as claimed in claim 1 wherein the difference in the main peak temperatures of the first and second solder alloys is at least 20° C.

6. A solder paste as claimed in claim 1 wherein the first solder alloy is a Sn—Ag—In—Bi alloy.

7. A solder paste as claimed in claim 1 wherein the second solder alloy contains greater than 0 and at most 1 mass % of Bi.

8. A solder paste as claimed in claim 1 wherein each of the first and second solder alloys contains greater than 0 and at most 1 mass % of Bi.

* * * * *